(12) United States Patent
Kamamoto et al.

(10) Patent No.: US 11,702,528 B2
(45) Date of Patent: Jul. 18, 2023

(54) POROUS POLYTETRAFLUOROETHYLENE MEMBRANE, GAS-PERMEABLE MEMBRANE, AND GAS-PERMEABLE MEMBER

(71) Applicant: NITTO DENKO CORPORATION, Osaka (JP)

(72) Inventors: Yu Kamamoto, Osaka (JP); Hisae Kitagawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/794,405

(22) PCT Filed: Jul. 2, 2021

(86) PCT No.: PCT/JP2021/025189
§ 371 (c)(1),
(2) Date: Jul. 21, 2022

(87) PCT Pub. No.: WO2022/004885
PCT Pub. Date: Jan. 6, 2022

(65) Prior Publication Data
US 2023/0068958 A1    Mar. 2, 2023

(30) Foreign Application Priority Data
Jul. 3, 2020   (JP) ................. 2020-115871

(51) Int. Cl.
*C08J 9/14*   (2006.01)
*H05K 5/02*   (2006.01)
(Continued)

(52) U.S. Cl.
CPC .......... *C08J 9/141* (2013.01); *B01D 39/1692* (2013.01); *B01D 46/543* (2013.01);
(Continued)

(58) Field of Classification Search
None
See application file for complete search history.

(56) References Cited

U.S. PATENT DOCUMENTS

2010/0104845 A1*  4/2010  MacLennan .......... B01D 71/36
                                                                428/221
2015/0165386 A1*  6/2015  Mori .................. B01D 39/1692
                                                                96/12
(Continued)

FOREIGN PATENT DOCUMENTS

JP    2011-52180 A    3/2011
JP    2015-111945 A   6/2015
(Continued)

OTHER PUBLICATIONS

ISR for PCT/JP2021/025189, dated Sep. 21, 2021.
Written Opinion of ISA for PCT/JP2021/025189, dated Sep. 21, 2021 (w/ translation).

*Primary Examiner* — Jason M Greene
(74) *Attorney, Agent, or Firm* — Greenblum & Bernstein, P.L.C.

(57) ABSTRACT

Provided is a porous polytetrafluoroethylene membrane in which an absolute value of a difference in lightness between one principal surface and the other principal surface is 1.0 or more, where the lightness is lightness $L^*$ of CIE 1976 ($L^*$, $a^*$, $b^*$) color space specified in JIS Z8781-4: 2013. The porous polytetrafluoroethylene membrane may be colored black or gray. The porous polytetrafluoroethylene membrane provided can have properties with a reduced coloring-induced deterioration.

9 Claims, 4 Drawing Sheets

(51) Int. Cl.
  *B01D 39/16* (2006.01)
  *B01D 46/54* (2006.01)
  *B29C 55/00* (2006.01)
  *B29C 55/14* (2006.01)
  *C08J 5/18* (2006.01)
  *B29K 27/18* (2006.01)
  *B29L 31/00* (2006.01)
  *H04M 1/02* (2006.01)

(52) U.S. Cl.
  CPC .......... *B29C 55/005* (2013.01); *B29C 55/143* (2013.01); *C08J 5/18* (2013.01); *H05K 5/0214* (2022.08); *B01D 2239/1291* (2013.01); *B29K 2027/18* (2013.01); *B29L 2031/755* (2013.01); *C08J 2203/14* (2013.01); *C08J 2327/18* (2013.01); *H04M 1/0202* (2013.01)

(56) References Cited

U.S. PATENT DOCUMENTS

| | | |
|---|---|---|
| 2015/0304767 A1 | 10/2015 | Mori et al. |
| 2016/0075838 A1 | 3/2016 | Watanabe et al. |
| 2018/0315409 A1 | 11/2018 | Matsuo et al. |
| 2019/0232211 A1 | 8/2019 | Niki et al. |
| 2021/0067851 A1 | 3/2021 | Fukushima et al. |

FOREIGN PATENT DOCUMENTS

| | | |
|---|---|---|
| JP | 2016-213829 A | 12/2016 |
| JP | 2018-51544 A | 4/2018 |
| JP | 2019-122044 A | 7/2019 |
| WO | WO 2014/175380 A1 | 10/2014 |

\* cited by examiner

Example 6

Comparative Example 2

Application surface

Porous PTFE membrane

Back surface

POROUS POLYTETRAFLUOROETHYLENE MEMBRANE, GAS-PERMEABLE MEMBRANE, AND GAS-PERMEABLE MEMBER

TECHNICAL FIELD

The present invention relates to a porous polytetrafluoroethylene membrane, and to a gas-permeable membrane and a gas-permeable member that include the porous polytetrafluoroethylene membrane.

BACKGROUND ART

Electronic devices with an audio function, such as smartphones, have a housing that is usually provided with an opening (sound-transmitting port) corresponding to an acoustic portion such as a speaker or a microphone. Furthermore, such a housing is sometimes provided with an opening (ventilation port) for reducing pressure variation inside the housing due to the temperature. According to a widely adopted technique, a gas-permeable membrane is disposed over an opening to permit sound and/or gas to pass therethrough while preventing water and dust from entering a housing through the opening. As the gas-permeable membrane, a porous polytetrafluoroethylene (hereinafter referred to as PTFE) membrane is known.

Porous PTFE membranes are usually white in color and accordingly are easily noticeable when disposed over an opening. Noticeable gas-permeable membranes can easily impair the design of electronic devices, and also stimulate the curiosity of users and accordingly are susceptible to damages by puncturing with a writing instrument or the like. The above problem can be suppressed by using a colored porous PTFE membrane. Patent Literature 1 discloses a porous PTFE membrane that is colored black.

CITATION LIST

Patent Literature

Patent Literature 1: JP 2011-52180 A

SUMMARY OF INVENTION

Technical Problem

According to studies by the present inventors, colored porous PTFE membranes are likely to deteriorate in properties as porous PTFE membranes, in typically waterproofness. The present invention aims to provide a colored porous PTFE membrane having properties with a reduced coloring-induced deterioration.

Solution to Problem

The present invention provides a porous polytetrafluoroethylene membrane,
the porous polytetrafluoroethylene membrane being colored, wherein
an absolute value of a difference in lightness between one principal surface and the other principal surface of the porous polytetrafluoroethylene membrane is 1.0 or more, where the lightness is lightness L* of CIE 1976 (L*, a*, b*) color space specified in JIS Z8781-4: 2013.

In another aspect, the present invention provides a gas-permeable membrane permitting gas to pass therethrough while shielding water and/or dust, the gas-permeable membrane including
the porous polytetrafluoroethylene membrane according to the present invention.

In another aspect, the present invention provides a gas-permeable member including:
the gas-permeable membrane according to the present invention; and
a support member supporting the gas-permeable membrane.

Advantageous Effects of Invention

According to the studies by the present inventors, it is assumed that conventional colored porous PTFE membranes deteriorate in properties as porous PTFE membranes, in typically waterproofness, because of comparatively uniform presence of a colorant from one principal surface to the other principal surface of the membrane. More specifically, it is assumed that the deterioration in waterproofness is caused by an increased permeability of water in a portion where the colorant is present. In contrast, in the porous PTFE membrane of the present invention, the absolute value of the difference in lightness between the one principal surface and the other principal surface is a predetermined value or more. This means that a small amount of a colorant is present on one of the principal surfaces, including its vicinity, that exhibits a relatively high lightness, in other words, that is close to the white color, and accordingly the original properties of the porous PTFE membrane can be maintained. Therefore, although being colored, the porous PTFE membrane of the present invention can have properties with a reduced deterioration.

DESCRIPTION OF EMBODIMENTS

Embodiments of the present invention will be described below. The present invention is not limited to the following embodiments.

[Porous PTFE Membrane]

Figure 1:
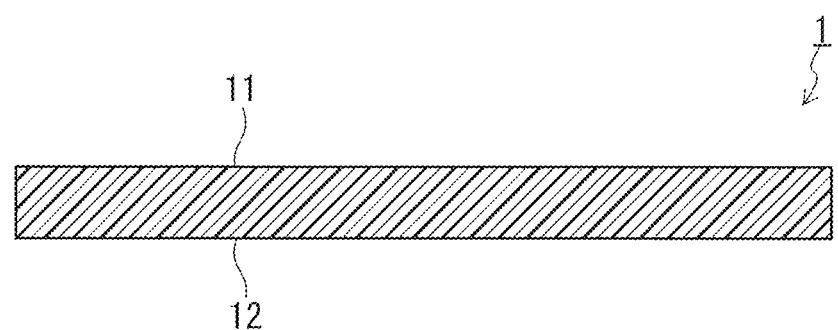
FIG. 1 is a cross-sectional view schematically showing an example of a porous PTFE membrane of the present invention.

FIG. 1 shows an example of a porous PTFE membrane of the present embodiment. A porous PTFE membrane 1 in FIG. 1 is colored. An absolute value d of a difference in lightness between one principal surface 11 and the other principal surface 12 of the porous PTFE membrane 1 is 1.0 or more. The absolute value d may be 2.0 or more, 3.0 or more, 3.5 or more, 4.0 or more, 5.0 or more, 6.0 or more, or even 7.0 or more. The upper limit of the absolute value d is, for example, 90.0 or less. Note that the above lightness is the lightness $L^*$ of CIE 1976 ($L^*$, $a^*$, $b^*$) color space specified in JIS Z8781-4: 2013. The lightness $L^*$ can be evaluated, for example, by using a measuring device such as a spectrocolorimeter or a colorimeter conforming to the above standards (e.g., spectrophotometer SE series manufactured by NIPPON DENSHOKU INDUSTRIES CO., LTD.). The evaluation is performed by normalizing the stimulus values X, Y, and Z in colorimetry of a standard white plate so as to fall within ±0.03 of the reference value. For the light source, auxiliary illuminant C for colorimetry specified in JIS Z8720: 2012 is used. The visual angle is set to 2 degrees.

Figure 2:
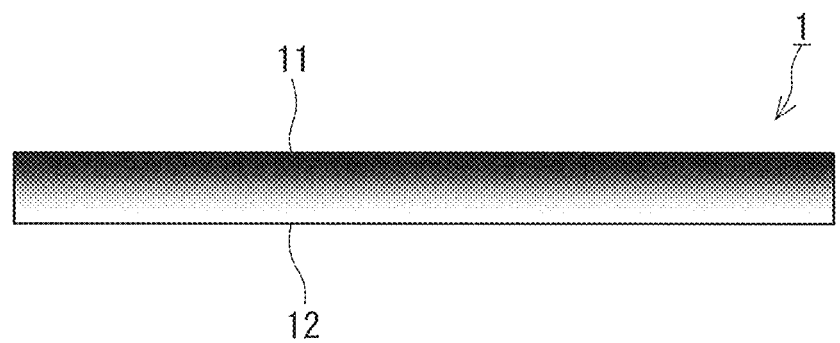
FIG. 2 is a cross-sectional view schematically showing an example of a coloring state of the porous PTFE membrane of the present invention.

As shown in FIG. 2, in the porous PTFE membrane 1, the principal surface 11 exhibits a relatively low lightness $L^*$ (high degree of coloring), whereas the principal surface 12 exhibits a relatively high lightness $L^*$ (low degree of coloring). When the cross section of the porous PTFE membrane 1 in the thickness direction is viewed, only the principal surface 11 and its vicinity may be colored, or coloring may be performed in a gradation manner in which the degree of coloring gradually decreases from the principal surface 11 toward the principal surface 12. However, the state of coloring of the porous PTFE membrane 1 is not limited to the above examples.

In the porous PTFE membrane 1, a principal surface exhibiting a relatively low lightness $L^*$ (the principal surface 11 in the examples in FIGS. 1 and 2), selected from the one principal surface 11 and the other principal surface 12, exhibits a lightness $L^*$ of, for example, 40 or less. The relatively low lightness $L^*$ may be 38 or less, 35 or less, 32 or less, 30 or less, 29 or less, 28 or less, 27.5 or less, 27 or less, 26 or less, 25 or less, 24 or less, 23 or less, 22 or less, 21 or less, 20 or less, 18 or less, 16 or less, or even 15 or less. Furthermore, a principal surface exhibiting a relatively high lightness $L^*$ (the principal surface 12 in the examples in FIGS. 1 and 2), selected from the one principal surface 11 and the other principal surface 12, exhibits a lightness $L^*$ of, for example, 28 or more. The relatively high lightness $L^*$ may be 30 or more, 31 or more, 32 or more, 33 or more, 34 or more, 35 or more, 37 or more, 38 or more, 39 or more, 40 or more, 42 or more, 44 or more, or even 45 or more. The lightness $L^*$ of a principal surface of an uncolored porous PTFE membrane is usually approximately 93 to 97.

The porous PTFE membrane 1 has properties with a reduced coloring-induced deterioration. This is presumably because the amount of the colorant is small on the principal surface 12 and in its vicinity, thereby facilitating the properties of the porous PTFE membrane before coloring to be maintained. The properties are typically the waterproofness.

The waterproofness of the porous PTFE membrane 1 can be expressed by water entry pressure (threshold water entry pressure).

According to the studies by the present inventors, porous PTFE membranes having higher waterproofness (higher water entry pressure) are more susceptible to a deterioration in waterproofness due to coloring. A porous PTFE membrane having high waterproofness is, for example, a membrane having a water entry pressure of 0.30 MPa or more as evaluated by a water resistance test method (Method A or Method B) specified in JIS L1092: 2009. From this viewpoint, the above water entry pressure of the porous PTFE membrane 1 may be 0.30 MPa or more, 0.35 MPa or more, 0.40 MPa or more, 0.43 MPa or more, 0.45 MPa or more, 0.47 MPa or more, 0.50 MPa or more, or even 0.52 MPa or more. The upper limit of the above water entry pressure is, for example, 3.00 MPa or less. The above water entry pressure may be a value obtained when the principal surface 11 is set as a water pressure application surface in the test. Furthermore, the above water entry pressure may be a value obtained when the surface and/or the inside of the membrane is not covered with a liquid-repellent agent. The liquid-repellent agent includes a water-repellent agent and an oil-repellent agent.

The water entry pressure of the porous PTFE membrane 1 can be measured using a measurement jig in accordance with the above water resistance test method, as follows. An example of the measurement jig is a stainless steel disc which has a diameter of 47 mm and is provided, at the center thereof, with a through hole (having a circular cross section) having a diameter of 1 mm. This disc has a sufficient thickness not to become deformed by the water pressure applied in measurement of the water entry pressure. Measurement of the water entry pressure using this measurement jig can be performed as follows.

The porous PTFE membrane 1 to be evaluated is fixed to one surface of the measurement jig so as to cover an opening of the through hole of the measurement jig. The fixation is performed such that no water leaks from a fixed portion of the membrane during measurement of the water entry pressure. For fixing the porous PTFE membrane 1, a double-sided adhesive tape can be used which has a water port punched in a center portion thereof with a shape that matches the shape of the opening. The double-sided adhesive tape can be disposed between the measurement jig and the porous PTFE membrane 1 such that the circumference of the water port matches the circumference of the opening. Next, the measurement jig, to which the porous PTFE membrane 1 is fixed, is set on a testing device such that a surface opposite to a surface of the measurement jig to which the porous PTFE membrane 1 is fixed is a water pressure application surface in the measurement. Then, the water entry pressure is measured in accordance with Method A (low water pressure method) or Method B (high water pressure method) of the water resistance test specified in JIS L1092: 2009. Note that the water entry pressure is measured based on the water pressure when water comes out from one spot on the membrane surface of the porous PTFE membrane 1. The measured water entry pressure can be regarded as the water entry pressure of the porous PTFE membrane 1. As the testing device, a device can be used which has the similar configuration to the water resistance testing device exemplified in JIS L1092: 2009 and has a test piece attachment structure in which the above measurement jig can be set.

A porous PTFE membrane is usually formed of countless PTFE fine fibers (fibrils), and may have a PTFE-aggregated portion (node) in which a plurality of fibrils are connected. The fibrils are typically formed by stretching a PTFE sheet, which is an aggregate of PTFE, and are exposed on the surface of the membrane. Accordingly, conventional colored membranes are likely to have uneven coloring of surfaces caused by concentration of a colorant in voids between fibrils. In contrast, the porous PTFE membrane 1 exhibits a high degree of coloring on the principal surface 11, and in the case where the same amount of a colorant is used, a larger amount of the colorant can be disposed on the principal surface 11 so as to cover fibrils than in conventional membranes. Accordingly, uneven coloring of the principal surface 11 can be reduced.

PTFE, which is the material forming the porous PTFE membrane 1, usually has a low ability to allow adhesion (e.g., adhesion by/to other material or member). On the other hand, in the porous PTFE membrane 1, a larger amount of a colorant can be disposed on the principal surface 11 so as to cover PTFE than in conventional membranes. Accordingly, the principal surface 11 of the porous PTFE membrane 1 can have an improved ability to allow adhesion. The principal surface 11 may have a higher ability to allow adhesion than the principal surface 12.

The ability of the principal surfaces 11 and 12 to allow adhesion can be expressed by a peel force as evaluated by a peel test in which an adhesive tape attached to each of the principal surfaces 11 and 12 is peeled off at 180° with respect to the principal surface. The principal surface 11 may have a higher peel force than the principal surface 12. The peel force of the principal surface 11 is, for example, 2.0 N/20 mm or more, and may be 2.2 N/20 mm or more, 2.5 N/20 mm or more, 2.7 N/20 mm or more, or even 3.0 N/20 mm or more. The upper limit of the peel force of the principal surface 11 is, for example, 10.0 N/20 mm or less. The peel force of the principal surface 12 is, for example, 1.5 N/20 mm or more, and may be 1.6 N/20 mm or more, 1.8 N/20 mm or more, 2.0 N/20 mm or more, or even 2.2 N/20 mm or more. The upper limit of the peel force of the principal surface 12 is, for example, 8.0 N/20 mm or less.

Figure 3:
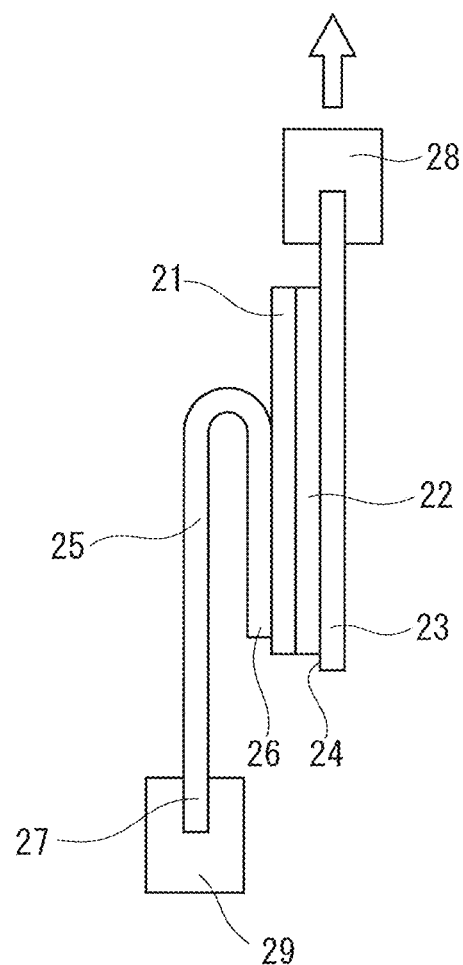
FIG. 3 is a schematic view for describing a method for evaluating the ability of a principal surface of a porous PTFE membrane to allow adhesion (peel force of the principal surface).

The peel test for determining the peel force will be described with reference to FIG. 3. The porous PTFE membrane 1 to be evaluated is cut into a rectangular shape to obtain a test piece 21. The test piece 21 is set to have a width of 25 mm or more. Separately, a stainless steel fixing plate 23 is prepared. The stainless steel fixing plate 23 has larger length and width than the test piece 21, and has a sufficient thickness not to become deformed during the test. Next, the test piece 21 is attached to the stainless steel fixing plate 23 with a double-sided adhesive tape 22 having the same shape as the test piece 21. The attachment of the test piece 21 is performed, such that when viewed in a direction perpendicular to an attachment surface 24 of the fixing plate 23, the outer periphery of the test piece 21 and the outer periphery of the double-sided adhesive tape 22 match each other, and the long side of the test piece 21 and the long side of the fixing plate 23 are parallel to each other, and also the entire test piece 21 is fixed to the fixing plate 23. As the double-sided adhesive tape 22, a double-sided adhesive tape having an adhesive force to a degree that the test piece 21 does not peel off from the fixing plate 23 during the test can be used, such as AS-42P150 manufactured by Nitto Denko Corporation. When having widths exceeding 25 mm, the test piece 21 and the double-sided adhesive tape may be cut after the attachment so as to have predetermined widths. Next, a double-sided adhesive tape 25 having a width of 20 nm (No. 5610 manufactured by Nitto Denko Corporation) is attached to an exposed surface of the test piece 21. The attachment of the double-sided adhesive tape 25 is performed, such that: the long side of the double-sided adhesive tape 25 and the long side of the test piece 21 are parallel to each other; and the double-sided adhesive tape 25 has one end portion 26 facing downward and being in contact with the test piece 21 and has the other end portion 27 being a free end. To ensure the measurement accuracy, an attachment portion of the double-sided adhesive tape 25 which is attached to the test piece 21 is preferably set to have a length of 120 mm or more. In the attachment portion of the double-sided adhesive tape 25 which is attached to the test piece 21, the entire double-sided adhesive tape 25 in its width direction is attached to the test piece 21. On a surface opposite to an attachment surface of the double-sided adhesive tape 25 which is attached to the test piece 21, a release liner is remained such that an adhesive face does not become exposed. Alternatively, after removal of the release liner, an additional film (e.g., a PET film having a thickness of approximately 25 µm) may be disposed such that the adhesive face does not become exposed. Note that the adhesive layer of the double-sided adhesive tape 25 is an acrylic adhesive layer, and the adhesive force of the double-sided adhesive tape 25 with respect to a stainless steel plate is approximately 17 N/20 mm as expressed by the 180° peel adhesive force in accordance with the test method 1 of the adhesive force specified in JIS Z0237: 2009 (see Items 10.3 and 10.4). In the case where the above adhesive tape (No. 5610) is not available, an adhesive tape can be used which has an equivalent adhesive force and has an attachment surface whose adhesive layer is an acrylic adhesive layer.

Next, to pressure-bond the test piece 21, the double-sided adhesive tape 22, the fixing plate 23, and the double-sided adhesive tape 25, a manual roller (having a mass of 2 kg specified in JIS Z0237: 2009) is reciprocated once with the fixing plate 23 facing downward. Next, one end of the fixing plate 23 is fixed to an upper chuck 28 of a tensile testing machine, and the end portion 27 of the double-sided adhesive tape 25 is folded back by 180° to be fixed to a lower chuck 29 of the tensile testing machine. Next, a 180° peel test was performed in which the double-sided adhesive tape 25 is peeled off from the test piece 21. The tensile speed is set to 300 mm/min. To ensure the measurement accuracy, the measurement value for the length of the initial 20 mm after the start of the test is ignored. Then, the measurement values of the adhesive force for the length of at least 60 mm peeled off from the test piece 21 are averaged, and this average is determined as the peel force (unit: N/20 mm) of the porous PTFE membrane 1. The test is performed in an environment at a temperature of 20±10° C. and a humidity of 50±10% RH.

In the porous PTFE membrane 1, since the absolute value d of the difference in lightness is the predetermined value or more, it is possible to comparatively easily distinguish between the principal surface 11 and the principal surface 12 by visual observation. This is advantageous in utilizing the properties differing between the principal surface 11 and the principal surface 12.

In the porous PTFE membrane 1, the disposition amount of the colorant differs between the principal surface 11 and the principal surface 12. For example, assume a case where the porous PTFE membrane 1 is disposed over an opening of a micro electro mechanical system (hereinafter referred to as MEMS). In this case, by disposing the porous PTFE membrane 1 such that the principal surface 12 having a small disposition amount of the colorant faces the inside of the MEMS, it is possible to prevent the MEMS from suffering from damage and function deterioration caused by detachment of the colorant or a thermal decomposition product of the colorant generated in high-temperature processing such as reflow soldering. Note that the effect exhibited by reducing detachment of the colorant or generation of the thermal decomposition product on the principal surface 12 is not limited to the case where the position where the porous PTFE membrane 1 is disposed is an opening of a MEMS.

The porous PTFE membrane 1 is typically colored black or gray. The porous PTFE membrane 1, which is colored black or gray, is inconspicuous by being disposed such that the principal surface 11 exhibiting a relatively low lightness L* is visible from the outside. Note that the color for coloring is not limited to the above examples. The black color and the gray color as used herein respectively mean an achromatic color exhibiting a lightness L* of 40 or less and an achromatic color exhibiting a lightness L* of more than 40 and 60 or less. The color of the principal surface 11 may be determined as the color for coloring. Additionally, the black color and the gray color may have a slight color tone depending on the series of colorants which are black colorants (the color of the black colorant might be invisible as a pure achromatic color, especially when its disposition amount is small). In consideration of this, the black color and the gray color as used herein may include colors in which the absolute values of a* and b* in CIE1976 (L*, a', b*) color space both fall within the range from 0 to 12.

Although the colorant may be a dye or a pigment, the colorant is preferably a dye from the viewpoint of preventing detachment from the porous PTFE membrane 1. Detachment from the porous PTFE membrane 1 might cause discoloration of the porous PTFE membrane 1, or might cause damage to electrical circuits or electronic components located near the porous PTFE membrane 1 when the colorant is conductive. Furthermore, when the colorant is a dye or an insulating pigment, the porous PTFE membrane 1 that is insulating can be achieved based on high insulating properties derived from PTFE. The insulating properties are expressed by a surface resistivity of, for example, $1 \times 10^{14} \Omega/\square$ or more on at least one of the principal surfaces 11 and 12. The surface resistivity may be $1 \times 10^{15} \Omega/\square$ or more, $1 \times 10^{16} \Omega/\square$ or more, or even $1 \times 10^{17} \Omega/\square$ or more.

Examples of the dye include an azo dye and an oil-soluble dye. Examples of the pigment include carbon black and a metal oxide. However, the dye and the pigment are not limited to the above examples.

The average pore diameter of the porous PTFE membrane 1 is, for example, 0.01 to 5 μm, and may be 2 μm or less or even 1 μm or less. However, depending on the average pore diameter of the original porous PTFE membrane before coloring, the porous PTFE membrane 1 can have an average pore diameter outside the above range. The average pore diameter of the porous PTFE membrane 1 can be measured in accordance with American Society for Testing and Materials (ASTM) F316-86.

The porosity of the porous PTFE membrane 1 is, for example, 50 to 99%. However, depending on the porosity of the original porous PTFE membrane before coloring, the porous PTFE membrane 1 can have a porosity outside the above range. The porosity of the porous PTFE membrane 1 can be calculated by substituting the mass, the thickness, the area (area of the principal surface), and the true density of the membrane into the following equation. Note that the true density of PTFE is 2.18 g/cm³.

Porosity (%)={1−(mass[g]/(thickness[cm]×area [cm²]×true density[g/cm³]))}×100    Equation The thickness of the porous PTFE membrane 1 may be 100 μm or less, 75 μm or less, 50 μm or less, or even 25 μm or less, and may fall beyond these ranges depending on the use applications. The lower limit of the thickness is, for example, 5 μm or more.

The porous PTFE membrane 1 has a gas permeability in the thickness direction of, for example, less than 200 seconds/100 mL, as expressed by an air permeability obtained in accordance with Method B (Gurley method) of air permeability measurement specified in JIS L1096: 2010. The Gurley air permeability may be 150 seconds/100 mL or less, 100 seconds/100 mL or less, 50 seconds/100 mL or less, 25 seconds/100 mL or less, 20 seconds/100 mL or less, 15 seconds/100 mL or less, 12 seconds/100 mL or less, 10 seconds/100 mL or less, 8 seconds/100 mL or less, or even 7 seconds/100 mL or less. The lower limit of the Gurley air permeability is, for example, 0.2 seconds/100 mL or more, and may be 0.3 seconds/100 mL or more, 0.5 seconds/100 mL or more, 1 second/100 mL or more, 1.5 seconds/100 mL or more, 2 seconds/100 mL or more, 2.5 seconds/100 mL or more, 3 seconds/100 mL or more, or even 3.5 seconds/100 mL or more. However, depending on the gas permeability of the original porous PTFE membrane before coloring, the porous PTFE membrane 1 can have a gas permeability in the thickness direction outside the above range.

Even when the size of the porous PTFE membrane 1 does not satisfy the test piece size (approximately 50 mm×50 mm) in the Gurley method, it is possible to evaluate the Gurley air permeability by using a measurement jig. An example of the measurement jig is a polycarbonate disc provided with a through hole (having a circular cross section with a diameter of 1 mm or 2 mm) at the center thereof and having a thickness of 2 mm and a diameter of 47 mm. Measurement of the Gurley air permeability using this measurement jig can be performed as follows.

The porous PTFE membrane 1 to be evaluated is fixed to one of surfaces of the measurement jig so as to cover the opening of the through hole of the measurement jig. The fixation is performed such that, during measurement of a Gurley air permeability, air passes through only the opening and an effective test portion (portion overlapping the opening when viewed in a direction perpendicular to a principal surface of the fixed porous PTFE membrane 1) of the porous PTFE membrane 1 to be evaluated, and the fixed portion of the porous PTFE membrane 1 does not hinder passage of air through the effective test portion of the porous PTFE membrane 1. For fixing the porous PTFE membrane 1, a double-sided adhesive tape having a ventilation port punched in a center portion thereof with a shape that matches the shape of the opening can be used. The double-sided adhesive tape can be placed between the measurement jig and the porous PTFE membrane 1 such that the circumference of the ventilation port and the circumference of the opening match each other. Next, the measurement jig having the porous PTFE membrane 1 fixed thereto is set on a Gurley air permeability testing machine such that the surface on which the porous PTFE membrane 1 is fixed is at the downstream side of airflow during measurement, and a time t1 taken for 100 mL of air to pass through the porous PTFE membrane 1 is measured. Next, the measured time t1 is converted into a value t per effective test area of 642 [mm²] specified in Method B (Gurley method) of air permeability measurement in JIS L1096: 2010, by the equation t={(t1)×(area of effective test portion of porous PTFE membrane [mm²])/642 [mm²]}, and the obtained conversion value t can be regarded as the Gurley air permeability of the porous PTFE membrane 1. When the above disc is used as the measurement jig, the area of the effective test portion of the porous PTFE membrane 1 is the area of the cross section of the through hole. It has been confirmed that the Gurley air permeability measured without using the measurement jig for the porous PTFE membrane 1 satisfying the above test piece size and the Gurley air permeability measured using the measurement jig after fragmenting the porous PTFE membrane 1 coincide well with each other, that is, the use of the measurement jig does not substantially affect the measured values of the Gurley air permeability.

The shape of the porous PTFE membrane 1 is, for example, a polygon including a square and a rectangle, a circle, an ellipse, an irregular shape, or a band when viewed in a direction perpendicular to the principal surfaces 11 and 12. However, the shape of the porous PTFE membrane 1 is not limited to the above examples.

The porous PTFE membrane 1 in FIG. 1 is a single layer.

The porous PTFE membrane 1 may be a membrane subjected to a liquid-repellent treatment. The liquid-repellent treatment can be performed by a known method. The liquid-repellent treatment includes a water-repellent treatment and an oil-repellent treatment. The porous PTFE membrane 1 may be a membrane subjected to no liquid-repellent treatment, in other words, a membrane whose surface and/or interior is not covered with a liquid-repellent agent.

The porous PTFE membrane 1 can be used, for example, as a gas-permeable membrane permitting gas to pass therethrough while shielding water and/or dust. Examples of the gas-permeable membrane include a waterproof membrane that is disposed over an opening to permit sound and/or gas to pass therethrough while preventing water entry through the opening, and a dustproof membrane that is disposed over an opening to permit sound and/or gas to pass therethrough while preventing dust entry through the opening. Examples of the opening include an opening provided in a housing of an electronic device and an opening of an electronic component. Examples of the electronic component include a MEMS. Examples of the MEMS include an acoustic element such as a speaker and a microphone, and a sensor element such as a pressure sensor, an oxygen sensor, and air temperature sensor. Examples of the electronic device include: an information device such as a smartphone and a tablet PC; a device for vehicles such as a lamp, an ECU, a motor, and a battery; an electric product such as an electric toothbrush and an electric shaver; and an acoustic device such as a speaker and a microphone. However, the use applications of the porous PTFE membrane 1, the gas-permeable membrane, the opening, the electronic device, and the electronic component are each not limited to the above examples. The porous PTFE membrane 1 may be disposed over the opening such that the principal surface 11, which exhibits a relatively low lightness L*, faces the outside of the housing or the outside of the electronic component. Furthermore, the porous PTFE membrane 1 may be disposed over the opening such that the principal surface 12, which exhibits a relatively high lightness L*, faces the inside of the housing or the inside of the electronic component.

Hereinafter, a method for manufacturing the porous PTFE membrane 1 will be described. However, the method for manufacturing the porous PTFE membrane 1 is not limited to the following examples.

The porous PTFE membrane 1 can be manufactured, for example, by applying a coloring liquid containing a colorant to one principal surface of an original porous PTFE membrane before coloring, and then removing a solvent and/or a dispersion medium (hereinafter, a solvent and a dispersion medium are collectively referred to as "solvent") contained in the dyeing liquid by drying or the like. For the application, a known application method is adoptable. Note that the principal surface to which the coloring liquid has been applied (application surface) is usually the principal surface 11, which exhibits a relatively low lightness L*.

The coloring liquid preferably contains a solvent having a surface tension of 25 mN/m or more at 20° C. and/or a solvent having a relative permittivity of 5.0 or less at 20° C. The coloring liquid containing the above solvent can have a low wettability relative to PTFE. Accordingly, when the coloring liquid is applied to the original porous PTFE membrane, infiltration of the coloring liquid into the membrane can be suppressed, so that a large amount of the colorant can be retained on the application surface. Especially in the case where the original porous PTFE membrane has a small thickness, the coloring liquid easily infiltrates up to a surface opposite to the application surface. For this reason, the above solvent is desirably contained in the coloring liquid. The surface tension (at 20° C.) of the solvent may be 27 mN/m or more, 28 mN/m or more, 29 mN/m or more, or even 30 mN/m or more. The relative permittivity (at 20° C.) of the solvent may be 4.0 or less, 3.0 or less, or even 2.5 or less. However, the appropriate ranges of the surface tension and the relative permittivity of the solvent differ depending on the type of colorant, the microporous structure of the porous PTFE membrane, and the like.

In the case where the solvent is a mixed solvent of two or more solvent species, the solvent preferably contains a solvent species having a surface tension of 25 mN/m or more at 20° C. and/or a solvent species having a relative permittivity of 5.0 or less at 20° C. The surface tension (at 20° C.) of the solvent species may be 27 mN/m or more, 28 mN/m or more, 29 mN/m or more, or even 30 mN/m or more. The relative permittivity (at 20° C.) of the solvent species may be 4.0 or less, 3.0 or less, or even 2.5 or less. Examples of the solvent species satisfying the above surface tension and/or the above relative permittivity include toluene, cyclohexane, xylene, and cyclopentyl methyl ether. The solvent may contain the above solvent species in a content of 25 to 90 volume % or in a content of 50 to 90 volume %. The solvent may consist of the above solvent species. Alternatively, the solvent may contain a solvent species that does not satisfy the above range for the surface tension and/or the relative permittivity as long as the porous PTFE membrane 1 can be achieved. The solvent species, which does not satisfy the above range, can be added to the solvent, for example, to improve the application properties of the coloring liquid relative to the original porous PTFE membrane.

The boiling point of the solvent species contained in the solvent may be 90° C. or more, 100° C. or more, 105° C. or more, or even 110° C. or more. The upper limit of the boiling point of the solvent species may be 180° C. or less. The solvent containing the solvent species having a boiling point within the above range can contribute to more uniform coloring of the application surface (the principal surface 11).

The coloring liquid preferably does not contain a liquid-repellent agent. Liquid-repellent agents usually have a high polarity, and also are fluorine compounds in many cases, resulting in an increase in wettability of a coloring liquid relative to PTFE, which is a fluorine resin. Additionally, containing no liquid-repellent agent in the coloring liquid can suppress a deterioration in gas permeability (an increase in Gurley air permeability) due to infiltration of the liquid-repellent agent into the membrane. In other words, in the case where the gas permeability of the membrane is regarded as important, the coloring liquid may not contain a liquid-repellent agent. The liquid-repellent agent includes a water-repellent agent and an oil-repellent agent. To achieve a porous PTFE membrane subjected to a liquid-repellent treatment while avoiding the above problem on the wettability of the coloring liquid, the porous PTFE membrane before or after coloring may be subjected to a liquid-repellent treatment separately from a coloring treatment with the coloring liquid.

In the case where the colorant is a dye, the concentration of the dye in the coloring liquid (dyeing liquid) is, for example, 1 weight % or more, and may be 2 weight % or more.

In the case where the coloring liquid contains a liquid-repellent agent, the addition amount of the liquid-repellent agent per 100 parts by weight of the colorant is, for example, less than 20 parts by weight, and may be 18 parts by weight or less or even 16 parts by weight or less.

The original porous PTFE membrane can be formed by a known method. The original porous PTFE membrane can be formed, for example, as follows: a kneaded product of a PTFE fine powder and a molding aid is formed into a sheet by extrusion molding and rolling; the molding aid is removed from the sheet to obtain a sheet molded body; and then furthermore the sheet molded body is stretched. Note that the properties of the porous PTFE membrane 1 can be adjusted by the rolling conditions and the stretching conditions.

[Gas-Permeable Membrane]

Figure 4:
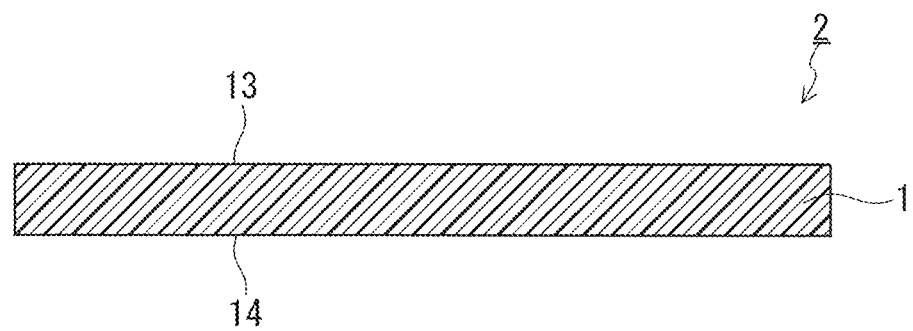
FIG. 4 is a cross-sectional view schematically showing an example of a gas-permeable membrane of the present invention.

FIG. 4 shows an example of a gas-permeable membrane of the present invention. A gas-permeable membrane 2 in FIG. 4 includes the porous PTFE membrane 1, and more specifically, has a single-layer structure of the porous PTFE membrane 1. The gas-permeable membrane 2 is a membrane permitting gas to pass therethrough while shielding water and/or dust. The gas-permeable membrane 2 is colored. An absolute value d of a difference in lightness L* between one principal surface 13 and the other principal surface 14 of the gas-permeable membrane 2 is 1.0 or more. The gas-permeable membrane 2 can have each of the properties described above in the description of the porous PTFE membrane 1 including the preferred aspects. The gas-permeable membrane 2 can be disposed over an opening of a housing of an electronic device or over an opening of an electronic component, for example, such that the principal surface 13 exhibiting a relatively low lightness L* faces the outside. Furthermore, the gas-permeable membrane 2 may be disposed over an opening of a housing of an electronic device or over an opening of an electronic component such that the principal surface 14 exhibiting a relatively high lightness L* faces the inside.

When disposed over the above opening, the gas-permeable membrane 2 may have a thickness within the range of 3 to 30 μm. The upper limit of the thickness may be 25 μm or less, 20 μm or less, or even 15 μm or less. The lower limit of the thickness may be 5 μm or more.

When disposed over the above opening, the gas-permeable membrane 2 may have a surface density within the range of 1 to 30 g/m². The upper limit of the surface density may be 20 g/m² or less, 15 g/m² or less, 10 g/m² or less, or even 5 g/m² or less. The lower limit of the surface density may be 2 g/m² or more. The surface density can be calculated by dividing the mass of the gas-permeable membrane 2 by the area (area of the principal surface) of the gas-permeable membrane 2.

The shape of the gas-permeable membrane 2 is, for example, a polygon including a square and a rectangle, a circle, an ellipse, an irregular shape, or a band when viewed in a direction perpendicular to the principal surfaces 13 and 14. However, the shape of the gas-permeable membrane 2 is not limited to the above examples.

Figure 5:
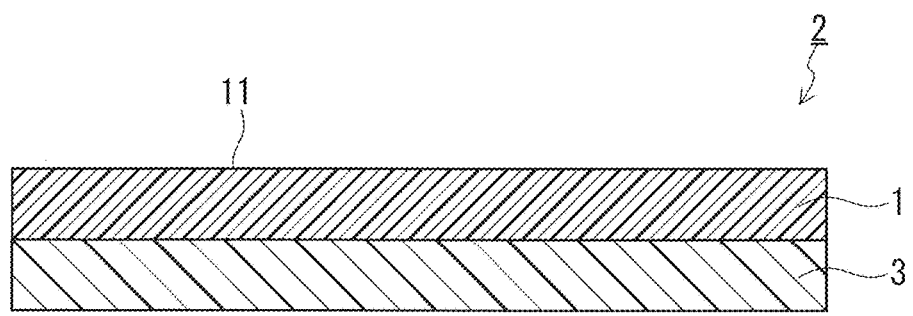
FIG. 5 is a cross-sectional view schematically showing another example of the gas-permeable membrane of the present invention.

FIG. 5 shows another example of the gas-permeable membrane of the present invention. The gas-permeable membrane 2 in FIG. 5 has a laminated structure of the porous PTFE membrane 1 and a gas-permeable support member 3 supporting the porous PTFE membrane 1. In the gas-permeable membrane 2 in FIG. 5, the principal surface 11, which exhibits a relatively low lightness L*, of the porous PTFE membrane 1 is exposed. The gas-permeable membrane 2 in FIG. 5 can be disposed over an opening of a housing of an electronic device or over an opening of an electronic component, for example, such that the principal surface 11 faces the outside.

The gas-permeable support member 3 preferably has better gas permeability than the porous PTFE membrane 1. Examples of the gas-permeable support member 3 include a woven fabric, a nonwoven fabric, a mesh, a net, a sponge, a foam, and a porous body each of which are formed from a metal, a resin, or a composite material of the metal and the resin. Examples of the resin include polyolefin, polyester, polyamide, polyimide, aramid, a fluorine resin, and an ultra-high molecular weight polyethylene. For laminating the porous PTFE membrane 1 and the gas-permeable support member 3, various joining methods can be used, such as thermal lamination, heat welding, or ultrasonic welding.

[Gas-Permeable Member]

Figure 6A:
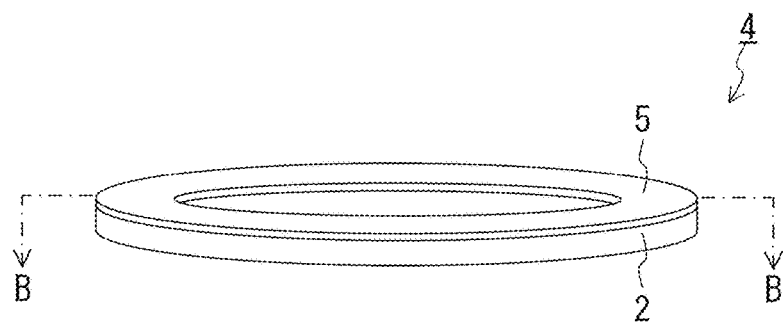
FIG. 6A is a perspective view schematically showing an example of a gas-permeable member of the present invention.
Figure 6B:
FIG. 6B is a cross-sectional view showing a cross section B-B of the gas-permeable member shown in FIG. 6A.

FIGS. 6A and 6B show an example of a gas-permeable member of the present invention. FIG. 6B shows a cross section B-B of the gas-permeable member 4 in FIG. 6A. The gas-permeable member 4 in FIGS. 6A and 6B includes the gas-permeable membrane 2 and a support member 5 supporting the gas-permeable membrane 2. In the example in FIGS. 6A and 6B, the shape of the gas-permeable membrane 2 is a circle when viewed in the direction perpendicular to the principal surfaces 13 and 14, whereas the shape of the support member 5 is a shape corresponding to the shape of a peripheral portion of the gas-permeable membrane 2, specifically a ring, when viewed in the above direction. However, the shapes of the gas-permeable membrane 2 and the support member 5 are not limited to the above example as long as the gas-permeable membrane 2 can be supported by the support member 5. The gas-permeable member 4 including the support member 5 can reinforce the gas-permeable membrane 2 and also can improve the handling properties of the gas-permeable membrane 2. Additionally, the support member 5 can serve as a margin for attachment of the gas-permeable membrane 2.

The material of the support member 5 is typically a resin, a metal, or a composite material of these. The support member 5 may be a double-sided adhesive tape.

For laminating the gas-permeable membrane 2 and the support member 5, various joining methods can be used such as thermal lamination, heat welding, ultrasonic welding, or joining with an adhesive.

Figure 7A:
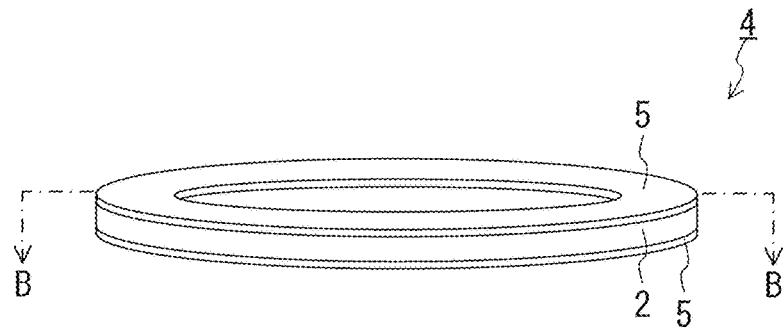
FIG. 7A is a perspective view schematically showing another example of the gas-permeable member of the present invention.
Figure 7B:
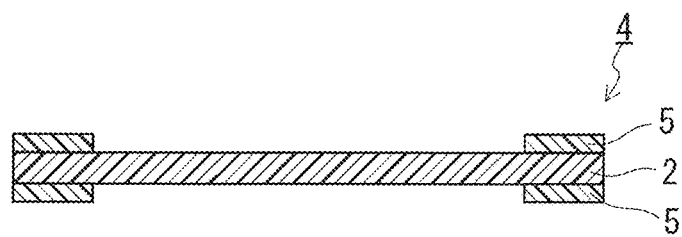
FIG. 7B is a cross-sectional view showing a cross section B-B of the gas-permeable member shown in FIG. 7A.

In the gas-permeable member 4 in FIGS. 6A and 6B, the support member 5 is disposed on one side of the gas-permeable membrane 2. The support member 5 may be disposed on each side of the gas-permeable membrane 2. In the gas-permeable member 4 in FIGS. 7A and 7B, the support member 5 is disposed on each side of the gas-permeable membrane 2, and a pair of the support members 5 sandwich therebetween the gas-permeable membrane 2 in its thickness direction. Although the pair of the support members 5 shown in FIGS. 7A and 7B have the identical shape, the support members 5 may have different shapes. FIG. 7B shows the cross section B-B of the gas-permeable member 4 in FIG. 7A.

The gas-permeable member 4 may be a waterproof member including the gas-permeable membrane 2 as a waterproof membrane. The gas-permeable member 4 may be a dustproof member including the gas-permeable membrane 2 as a dustproof membrane.

EXAMPLES

Hereinafter, the present invention will be described in more detail by way of examples. The present invention is not limited to the following examples.

A method of evaluating porous PTFE membranes produced in the examples will be described.

[Lightness L*]

The lightness L* of the principal surface was evaluated as the lightness L* of CIE 1976 (L*, a*, b*) color space with a spectrocolorimeter capable of evaluation in accordance with JIS Z8781-4: 2003 (SE6000 manufactured by NIPPON DENSHOKU INDUSTRIES CO., LTD.). The evaluation was performed for each of an application surface for a dyeing liquid and a surface opposite to the application surface (hereinafter referred to as "back surface"). The measurement conditions were as follows.

Light source: Auxiliary illuminant C for colorimetry specified in JIS Z8720: 2012

Visual angle: 2 degrees

Normalization is performed such that the stimulus values X, Y, and Z in colorimetry of a standard white plate fall within ±0.03 of the reference value.

[Water Entry Pressure]

The water entry pressure (threshold water entry pressure) was evaluated by the method described above. Note that the evaluation was performed in which the application surface and the back surface were each set as a water pressure application surface.

[Ability to Allow Adhesion]

The ability of the principal surfaces to allow adhesion was evaluated as the peel force of the principal surfaces by the method described above. The width of the test piece 21 was set to 25 mm, and AS-42PI50 manufactured by Nitto Denko Corporation was used as the double-sided adhesive tape 22. The length of the attachment portion of the double-sided adhesive tape 25 (No. 5610 manufactured by Nitto Denko Corporation) which is attached to the test piece 21 was set to 120 mm. On the surface opposite to the attachment surface of the double-sided adhesive tape 25 which is attached to the test piece 21, a PET membrane having a thickness of 25 μm was disposed such that an adhesive face did not become exposed. Evaluation was performed on each of the application surface and the back surface.

[Gas Permeability in Thickness Direction]

The gas permeability in the thickness direction was evaluated as the Gurley air permeability by the method described above.

(Production of Original Porous PTFE Membrane)

An amount of 100 parts by weight of a PTFE fine powder (F104 manufactured by DAIKIN INDUSTRIES, LTD.) and 20 parts by weight of n-dodecane (manufactured by Japan Energy Corporation) serving as a molding aid were uniformly mixed. The resulting mixture was compressed using a cylinder and then was molded to be sheet-like by ram extrusion. Next, the sheet-like mixture was passed through a pair of metal rolls to be rolled so as to have a thickness of 0.2 mm. Subsequently, the sheet-like mixture was stretched in the width direction at a stretch ratio of 4.5 times, and furthermore was heated at 150° C. to dry and remove the molding aid. Thus, a sheet molded body was obtained. Next, the sheet molded body was stretched in the longitudinal direction (rolling direction) at a stretch temperature of 300° C. and a stretch ratio of 4 times, and then was stretched in the width direction at a stretch temperature of 150° C. and a stretch ratio of 25 times. Furthermore, the sheet molded body was fired at 400° C. Thus, an original porous PTFE membrane was obtained. The obtained original porous PTFE membrane had an average pore diameter of 0.2 μm, a porosity of 78%, and a gas permeability of 3.3 seconds/100 mL in the thickness direction. The values of average pore diameter and porosity were hardly changed even after dyeing.

Examples 1 to 5

Prepared as a dyeing liquid was a mixture of a black dye (SP BLACK 91 L manufactured by Orient Chemical Industries Co., Ltd., having a concentration of the dye of 25 weight %) and a solvent. The solvent was added such that the concentration (solid content concentration; the same applies hereinafter) of the dye in the dyeing liquid was 1.5 weight % (Examples 1 to 4) or 2.0 weight % (Example 5). Used as the solvent was a mixed solution of toluene and methyl ethyl ketone (MEK) (Examples 1 to 4) or toluene (Example 5). The mixing ratio as expressed by volume ratio was set to toluene:MEK=25:75 (Example 1), 50:50 (Example 2), 75:25 (Example 3), or 90:10 (Example 4). Toluene has a surface tension of 28.5 mN/m at 20° C. and a relative permittivity of 2.3 at 20° C. MEK has a surface tension of 24.5 mN/m at 20° C. and a relative permittivity of 15.5 at 20° C.

Next, the prepared dyeing liquid was applied to one principal surface of the original porous PTFE membrane, and then was naturally dried in an atmosphere at 20° C. and a relative humidity of 50% to obtain the porous PTFE membranes of Examples 1 to 5 colored with the above dye. The application of the dyeing liquid was performed using an applicator such that the application membrane had a thickness of 18.2 μm.

Comparative Example 1

A porous PTFE membrane of Comparative Example 1 was obtained in the similar manner to that in Example 1, except that MEK was used as the solvent to be mixed with the dye.

The evaluation results of the lightness L* of application surfaces and back surfaces of the examples and the comparative example are shown in Table 1 below.

TABLE 1

| | Solvent Toluene addition amount (volume %) | Lightness L* | | Absolute value d of difference in lightness L* |
|---|---|---|---|---|
| | | Application surface | Back surface | |
| Comparative Example 1 | 0 | 31.0 | 31.4 | 0.4 |
| Example 1 | 25 | 29.3 | 30.3 | 1.0 |
| Example 2 | 50 | 27.6 | 30.6 | 3.0 |
| Example 3 | 75 | 28.5 | 33.7 | 5.2 |
| Example 4 | 90 | 27.4 | 34.6 | 7.2 |
| Example 5 | 100 | 21.7 | 28.5 | 6.9 |

As shown in Table 1, as the addition amount of toluene contained in the solvent increased, the absolute value d of the difference in lightness L* increased between the application surface (the principal surface 11) exhibiting a relatively low lightness L* and the back surface (the principal surface 12) exhibiting a relatively high lightness L*.

Example 6

A porous PTFE membrane of Example 6 was obtained in the similar manner to that in Example 3 (the mixing ratio of the solvent was set to toluene:MEK=75: 25 (by the volume ratio)), except that the concentration of the dye in the dyeing liquid was set to 2.0 weight %.

Comparative Example 2

A porous PTFE membrane of Comparative Example 2 was obtained in the similar manner to that in Comparative Example 1 (the solvent is MEK of 100 volume %), except that the concentration of the dye in the dyeing liquid was set to 2.0 weight %.

Comparative Example 3

A porous PTFE membrane of Comparative Example 3 was obtained in the similar manner to that in Example 1, except that the solvent to be mixed with the dye was changed to ethanol and the concentration of the dye in the dyeing liquid was set to 2.0 weight %. Ethanol has a surface tension of 22.4 mN/m at 20° C. and a relative permittivity of 24.0 at 20° C.

Example 7

A porous PTFE membrane of Example 7 was obtained in the similar manner to that in Example 1, except that the solvent to be mixed with the dye was changed to xylene. Xylene has a surface tension of 30.0 mN/m at 20° C. and a relative permittivity of 2.3 at 20° C.

Example 8

A porous PTFE membrane of Example 8 was obtained in the similar manner to that in Example 1, except that the solvent to be mixed with the dye was changed to xylene and the concentration of the dye in the dyeing liquid was set to 2.0 weight %.

Comparative Example 4

A porous PTFE membrane of Comparative Example 4 was obtained in the similar manner to that in Example 1, except that the solvent to be mixed with the dye was changed to acetone. Acetone has a surface tension of 23.3 mN/m at 20° C. and a relative permittivity of 19.5 at 20° C.

Example 9

A porous PTFE membrane of Example 9 was obtained in the similar manner to that in Example 1, except that the solvent to be mixed with the dye was changed to toluene and a liquid-repellent agent containing a fluorine resin as a liquid-repellent component (No. 328 manufactured by NODA SCREEN Co., Ltd) was added to the dyeing liquid so as to have a solid content concentration of 0.23 weight %.

Comparative Example 5

A porous PTFE membrane of Comparative Example 5 was obtained in the similar manner to that in Example 9, except that the solvent to be mixed with the dye was changed to MEK.

Reference Example

The original porous PTFE membrane before dyeing was used as a reference example.

The dyeing liquids used in the examples and the comparative examples are shown in Table 2, and the evaluation results for the examples, the comparative examples, and the reference example are shown in Table 3.

TABLE 2

| | | Dye liquid | | |
|---|---|---|---|---|
| | | Solvent | Dye concentration (weight %) | Addition of liquid-repellent agent |
| Example | 6 | Toluene/MEK (75:25) | 2.0 | No |
| | 7 | Xylene | 1.5 | No |
| | 8 | Xylene | 2.0 | No |
| | 9 | Toluene | 1.5 | Yes |
| Comparative Example | 2 | MEK | 2.0 | No |
| | 3 | Ethanol | 2.0 | No |
| | 4 | Acetone | 1.5 | No |
| | 5 | MEK | 1.5 | Yes |

TABLE 3

| | | Porous PTFE membrane | | | | | | | |
|---|---|---|---|---|---|---|---|---|---|
| | | Lightness L* | | | Water entry pressure (MPa) | | Peel force (N/20 mm) | | Gas permeability |
| | | Application surface | Back surface | Absolute value d of difference | Application surface | Back surface | Application surface | Back surface | (seconds/ 100 mL) |
| Example | 6 | 28.0 | 45.0 | 17.0 | 0.54 | 0.50 | 3.1 | 1.8 | 6.0 |
| | 7 | 37.1 | 39.8 | 2.7 | 0.47 | 0.45 | — | — | 5.7 |
| | 8 | 31.0 | 38.0 | 7.0 | 0.44 | 0.45 | 2.2 | 2.2 | 6.5 |
| | 9 | 31.0 | 34.3 | 3.3 | 0.47 | 0.43 | 2.2 | 2.3 | 7.2 |
| Comparative Example | 2 | 32.0 | 32.0 | 0.0 | 0.22 | 0.26 | 1.6 | 1.3 | — |
| | 3 | 26.0 | 26.0 | 0.0 | 0.10 | 0.10 | 1.8 | 1.6 | — |
| | 4 | 42.3 | 41.7 | 0.6 | 0.30 | 0.26 | 1.8 | 1.8 | 4.5 |
| | 5 | 30.4 | 30.9 | 0.5 | 0.44 | 0.37 | 2.1 | 2.1 | 6.4 |

TABLE 3-continued

| | Porous PTFE membrane | | | | | | |
|---|---|---|---|---|---|---|---|
| | Lightness L* | | | Water entry pressure | | Peel force | | Gas |
| | | | Absolute | (MPa) | | (N/20 mm) | | permeability |
| | Application surface | Back surface | value d of difference | Application surface | Back surface | Application surface | Back surface | (seconds/ 100 mL) |
| Reference Example | — | — | — | 0.52 | 0.50 | 1.1 | 1.0 | 3.3 |

*The sign "—" indicates no measurement.

As shown in Table 3, the porous PTFE membranes of the examples could exhibit a high absolute value d of the difference in lightness L* between the application surface and the back surface, and could achieved a high water entry pressure and a high peel force for the application surface. In particular, in Example 6, the absolute value d of the difference in lightness L* reached 17.0, and the water entry pressure of the original porous PTFE membrane was maintained for the both surfaces. In contrast, the porous PTFE membranes of the comparative examples exhibited a low absolute value d of the difference in lightness L* between the application surface and the back surface (zero in Comparative Examples 2 and 3), and exhibited greatly low water entry pressure for the application surface and the back surface compared with the original porous PTFE membrane. Furthermore, the comparative examples exhibited a low degree of improvement in peel force of the original porous PTFE membrane compared with the examples.

Figure 8:
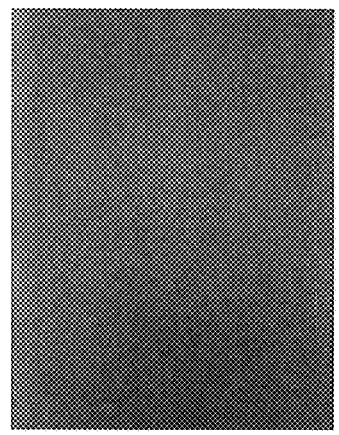
FIG. 8 is a view showing observation images of application surfaces to which dyeing liquids have been applied in porous PTFE membranes of Example 6 and Comparative Example 2.
Figure 8:
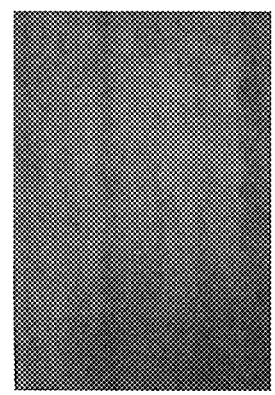

FIG. 8 shows observation images of the application surfaces of Example 6 and Comparative Example 2. As shown in FIG. 8, Example 6 could exhibit a reduced uneven coloring on the application surface exhibiting a relatively low lightness L* compared with Comparative Example 2.

Figure 9:
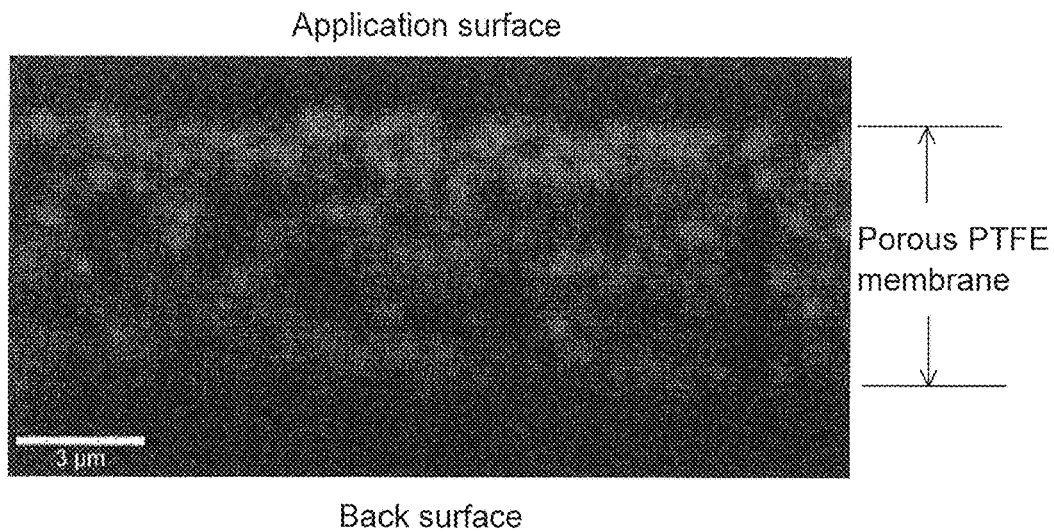
FIG. 9 is a diagram showing the distribution of a dye in a cross section of the porous PTFE membrane of Example 6.

FIG. 9 shows the evaluation result of the dye distribution with respect to the cross section of Example 6. The dye distribution was evaluated by mapping analysis using microscopic Raman. The cross section was cut out using a cryomicrotome. Used as the microscopic Raman spectrometer was a scanning near-field optical microscope (SNOM)/atomic force microscope (AFM)/Raman composite machine (alpha300 RSA manufactured by WITec). Used as the detector was an electron multiplying CCD (EMCCD) in which the magnification of the objective lens was set to 100 times. In microscopic Raman, the excitation wavelength was set to 532 nm and the measurement wave number was set to 125 to 3800 cm$^{-1}$. Additionally, the mapping of the dye was performed using the peak at the wave number of 1563 cm$^{-1}$ derived from an aromatic double bond of the dye as an index. As shown in FIG. 9, the distribution of the dye was concentrated on the application surface.

INDUSTRIAL APPLICABILITY

The porous PTFE membrane of the present invention can be used in the same use applications as conventional porous PTFE membranes. An example of the use applications is a gas-permeable membrane.

The invention claimed is:

1. A porous polytetrafluoroethylene membrane,
the porous polytetrafluoroethylene membrane being colored and being a single layer,
the porous polytetrafluoroethylene membrane comprising a first principal surface and a second principal surface, the first and second principal surfaces being in facing opposition to one another on opposing sides of the porous polytetrafluoroethylene membrane, wherein
an absolute value of a difference in lightness between the first principal surface and the second principal surface of the porous polytetrafluoroethylene membrane is 1.0 or more, where the lightness is lightness L* of CIE 1976 (L*, a*, b*) color space specified in JIS Z8781-4: 2013.

2. The porous polytetrafluoroethylene membrane according to claim 1, wherein the absolute value of the difference in the lightness is 3.0 or more.

3. The porous polytetrafluoroethylene membrane according to claim 1, wherein a principal surface exhibiting a relatively low lightness, selected from the first principal surface and the second principal surface, exhibits a lightness of 35 or less.

4. The porous polytetrafluoroethylene membrane according to claim 1, being colored black or gray.

5. The porous polytetrafluoroethylene membrane according to claim 1, having a water entry pressure of 0.30 MPa or more as evaluated by a water resistance test specified in JIS L1092: 2009.

6. The porous polytetrafluoroethylene membrane according to claim 1, being colored with a dye.

7. A gas-permeable membrane permitting gas to pass therethrough while shielding water and/or dust, the gas-permeable membrane comprising the porous polytetrafluoroethylene membrane according to claim 1.

8. A gas-permeable member comprising:
the gas-permeable membrane according to claim 7; and
a support member supporting the gas-permeable membrane.

9. The porous polytetrafluoroethylene membrane according to claim 1, wherein the lightness gradually decreases from the first principal surface toward the second principal surface, or from the second principal surface toward the first principal surface.

* * * * *